US009500924B2

(12) United States Patent
Qin et al.

(10) Patent No.: US 9,500,924 B2
(45) Date of Patent: Nov. 22, 2016

(54) ARRAY SUBSTRATE AND LIQUID CRYSTAL DISPLAY DEVICE

(71) Applicants: Shanghai AVIC Optoelectronics Co., Ltd., Shanghai (CN); Tianma Micro-Electronics Co., Ltd., Shenzhen (CN)

(72) Inventors: Dandan Qin, Shanghai (CN); Zhaokeng Cao, Shanghai (CN); Yongjun Wu, Shanghai (CN)

(73) Assignees: SHANGHAI AVIC OPTOELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/748,157

(22) Filed: Jun. 23, 2015

(65) Prior Publication Data
US 2015/0378228 A1 Dec. 31, 2015

(30) Foreign Application Priority Data
Jun. 30, 2014 (CN) .......................... 2014 1 0309487

(51) Int. Cl.
*G02F 1/136* (2006.01)
*G02F 1/1362* (2006.01)
*G02F 1/1343* (2006.01)
*H01L 27/12* (2006.01)

(52) U.S. Cl.
CPC ... *G02F 1/136286* (2013.01); *G02F 1/134336* (2013.01); *G02F 1/134363* (2013.01); *H01L 27/124* (2013.01); *H01L 27/1248* (2013.01); *G02F 2001/134372* (2013.01)

(58) Field of Classification Search
CPC .................. G02F 1/134336; G02F 1/134363; G02F 1/136286
USPC .......................................................... 349/43
See application file for complete search history.

(56) References Cited

U.S. PATENT DOCUMENTS

2003/0174269 A1* 9/2003 Tanaka .................. G02F 1/1393
349/129
2007/0070282 A1* 3/2007 Shibahara ......... G02F 1/134363
349/141

FOREIGN PATENT DOCUMENTS

| CN | 101165575 A | 4/2008 |
| JP | 2011-164661 A | 8/2011 |
| KR | 10-2013-0059181 A | 6/2013 |

* cited by examiner

Primary Examiner — Lucy Chien
(74) Attorney, Agent, or Firm — Alston & Bird LLP

(57) ABSTRACT

The array substrate includes: a substrate; a plurality of scan lines and a plurality of data lines disposed on the substrate intersecting each other to define a plurality of pixel elements and insulated from each other; a first transparent conductive layer disposed on the substrate; and a second transparent conductive layer disposed on the substrate and in parallel to and insulated from the first transparent conductive layer. The data lines, the first transparent conductive layer, and the second transparent conductive layer each comprise a plurality of bended portions, and the bended portions of the second transparent conductive layer are parallel to those of the first transparent conductive layer; additionally or alternatively; the bended portions of the data lines are parallel to those of the first transparent conductive layer or the second transparent conductive layer.

16 Claims, 5 Drawing Sheets

ARRAY SUBSTRATE AND LIQUID CRYSTAL DISPLAY DEVICE

CROSS-REFERENCES TO RELATED APPLICATIONS

This application claims the benefit of priority to Chinese Patent Application No. 201410309487.1, filed with the Chinese Patent Office on Jun. 30, 2014 and entitled "ARRAY SUBSTRATE AND LIQUID CRYSTAL DISPLAY DEVICE", the content of which is incorporated herein by reference in its entirety.

FIELD OF THE DISCLOSURE

The present disclosure relates to liquid crystal display technology, and more particularly to an array substrate and a liquid crystal display device including the array substrate.

BACKGROUND OF THE INVENTION

Currently one of predominant displays is a flat panel display. For example, a liquid crystal display device has been widely applied to a computer screen, a mobile phone, a personal digital assistant, a flat panel TV and other electronic products due to its lightweight and thin form factor, low power consumption, no radiation and other advantages.

In order to overcome the drawback of a small angle of view of a liquid crystal display device in the related art, a number of manufactures have developed liquid crystal display devices with a wide angle of view, and an in-plane switching liquid crystal display device is a superior display. Typically the in-plane switching liquid crystal display device includes upper and lower substrates disposed in opposition and a liquid crystal layer encapsulated between the two substrates, wherein gate lines, data lines, thin film transistors, pixel electrodes and common electrodes are disposed on the lower substrate. The in-plane switching liquid crystal display device has the advantages of a wide angle of view, high luminous efficiency and a high contrast because the pixel electrodes and the common electrodes are disposed on the same substrate and liquid crystal molecules are rotated in the same plane due to a transverse electric field, parallel to the substrate, between the pixel electrodes and the common electrodes.

However in the related art, the arrangement and rotation of the liquid crystal molecules may be disrupted when the liquid crystal display device is pressed, and at this time a displayed picture may be distorted, which is referred to as "Trace Mura". In order to prevent Trace Mura from occurring in the related art, a plurality of common electrodes can be bended at their both ends, while a part of the common electrodes may not be bended due to the limited distance between the common electrodes and the data lines, whereas the distance between the bendable common electrodes and the data lines may be too large so that a large overlying block of common electrode between the bendable common electrodes and the data lines may degrade the transmissivity of pixel elements, thereby degrading the display quality of the entire display device.

DETAILED DESCRIPTION OF THE INVENTION

Figure 1:
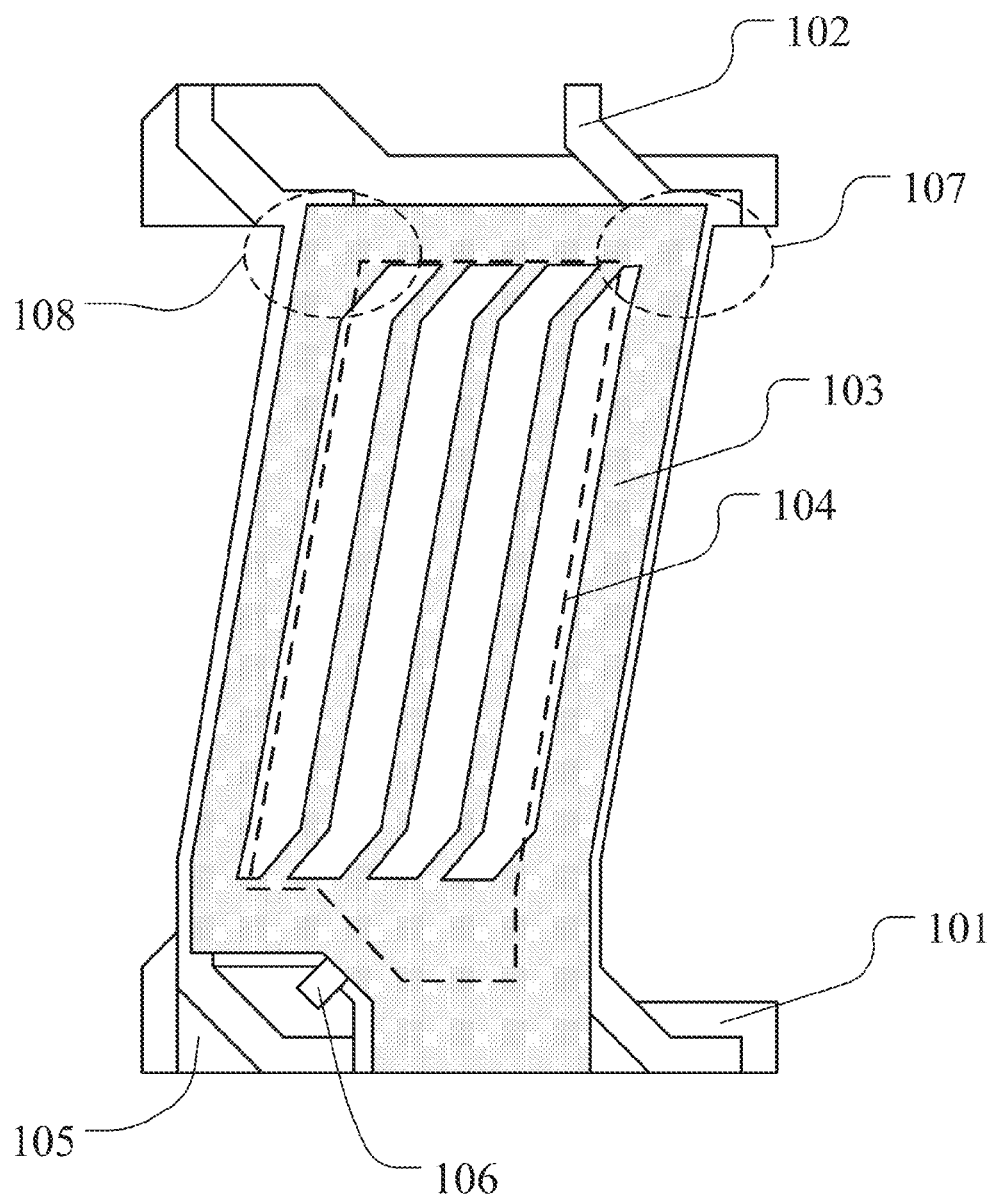
FIG. 1 illustrates a schematic structural diagram of an array substrate of an in-plane switching liquid crystal display device in the related art.

Referring to FIG. 1, FIG. 1 illustrates a schematic structural diagram of an array substrate of an in-plane switching liquid crystal display device in the related art. As can be apparent from FIG. 1, the array substrate of the in-plane switching liquid crystal display device in the related art includes: a substrate (not illustrated); a plurality of scan lines 101 and a plurality of data lines 102 disposed on the substrate to be intersect with each other to define a plurality of pixel elements and insulated from each other; and pixels electrodes 104 disposed in the pixel elements, wherein the pixels electrodes 104 are electrically connected with drains 106 of thin film transistors and a common electrode layer 103 is disposed on the pixels electrodes 104, wherein the common electrode layer 103 includes a plurality of common electrodes and hollow areas between the common electrodes. An insulation layer (not illustrated in the figure) is further disposed between the pixels electrodes 104 and the common electrode layer 103. In the related art, the arrangement and rotation of the liquid crystal molecules may be disturbed when the liquid crystal display device is pressed, and at this time a displayed picture may be disrupted, and this is referred to as "Trace Mura". In order to prevent Trace Mura from occurring in the related art, the plurality of common electrodes can be bended at their both ends, wherein a part of the common electrodes 103 may not be bended, as illustrated in the portion 107, due to the limited distance between the common electrodes 103 and the data lines 102, whereas the distance between the bendable common electrodes and the data lines may be too large, as illustrated in the portion 108, so that a large overlying block of common electrode between the bendable common electrodes and the data lines may degrade the transmissivity of pixel elements, thereby degrading the display quality of the entire display device.

The present disclosure will be further described below with reference to the drawings in which exemplary embodiments of the present disclosure are illustrated. However, the present disclosure can be embodied in a number of alternative forms but shall not be construed as being limited to the embodiments presented herein. It is to be understood that these embodiments are provided so that this disclosure will be thorough and complete and fully convey the scope of the present disclosure to those skilled in the art. Alike elements will be denoted throughout by alike reference numerals.

It shall be appreciated that when an element is referred to as "on" another element, the element can be directly on the other element or an intermediate element can be present between them. On the contrary, when an element is referred to as "directly on" another element, there is no intermediate element present. As used herein, the term "and/or" encompasses any and all of combinations of one or more of items listed therewith.

The terms used herein are merely for the purpose of describing example embodiments of the present disclosure only and is not intended to limit the present disclosure. As used herein, the terms "a", "an" may include singular and plural references unless otherwise indicated expressly in the context. It shall be further appreciated that the terms "include" and "comprise" are used in the present specification to indicate the presence of stated features, areas, integrals, steps, operations, elements and/or components but not to exclude the presence or addition of one or more other features, areas, integrals, steps, operations, elements, components and/or a group thereof.

Moreover, relative terms, e.g., "lower" or "bottom" and "upper" or "top" can be used herein to describe a relationship of one element relative to another element as illustrated in the figures. It shall be appreciated that the relative terms are intended to encompass other orientations of a device than those described in the drawings. For example, if the device in a figure is inverted, then an element described as on the "lower" side of another element shall be thereafter positioned on the "upper" side of the another element. Thus the illustrative term "lower" can encompass the directions of both "lower" and "upper" dependent upon the particular drawing of the figure. Similarly, if the device in a figure is inverted, then an element described as on the "lower" side of or "below" another element shall be thereafter positioned on the "upper" side of or "above" the another element. Thus the illustrative term "lower" or "below" can encompass the directions of both "upper" and "lower" or "above" and "below".

An embodiment of the present disclosure provides an array substrate including: a substrate; a plurality of scan lines and a plurality of data lines disposed on the substrate intersecting each other and insulated from each other; a plurality of pixel elements defined by the scan lines and the data lines; a first transparent conductive layer disposed on the substrate; and a second transparent conductive layer disposed on the substrate and in parallel to and insulated from the first transparent conductive layer. The data lines, the first transparent conductive layer, and the second transparent conductive layer each include a plurality of bended portions, and the bended portions of the second transparent conductive layer are parallel to those of the first transparent conductive layer; and/or the bended portions of the data lines are parallel to those of the first transparent conductive layer or the second transparent conductive layer.

An embodiment of the present disclosure further provides a liquid crystal display device including: the array substrate described above; a color filter substrate; and a liquid crystal layer encapsulated between the array substrate and the color filter substrate.

The data lines, the first transparent conductive layer, the second transparent conductive layer and a black matrix layer in the display device according to the present disclosure each include a plurality of bended portions parallel to each other, resulting in a three-segment bended pixel structure to thereby make full use of a pixel space and improve the transmissivity of pixel elements so as to improve the transmissivity throughout a panel, and the bended portions of the data lines, the first transparent conductive layer and the second transparent conductive layer are parallel to each other to thereby avoid the problem of non-uniform display caused by inconsistent parasitic capacitances between the edges of the first transparent conductive layer or the second transparent conductive layer and the data lines due to inconsistent distances between the edges of the first transparent conductive layer or the second transparent conductive layer and the data lines.

In order to make the objects, features and advantages above of the present disclosure more apparent, the present disclosure will be further described below with reference to the drawings and embodiments thereof.

Figure 2:
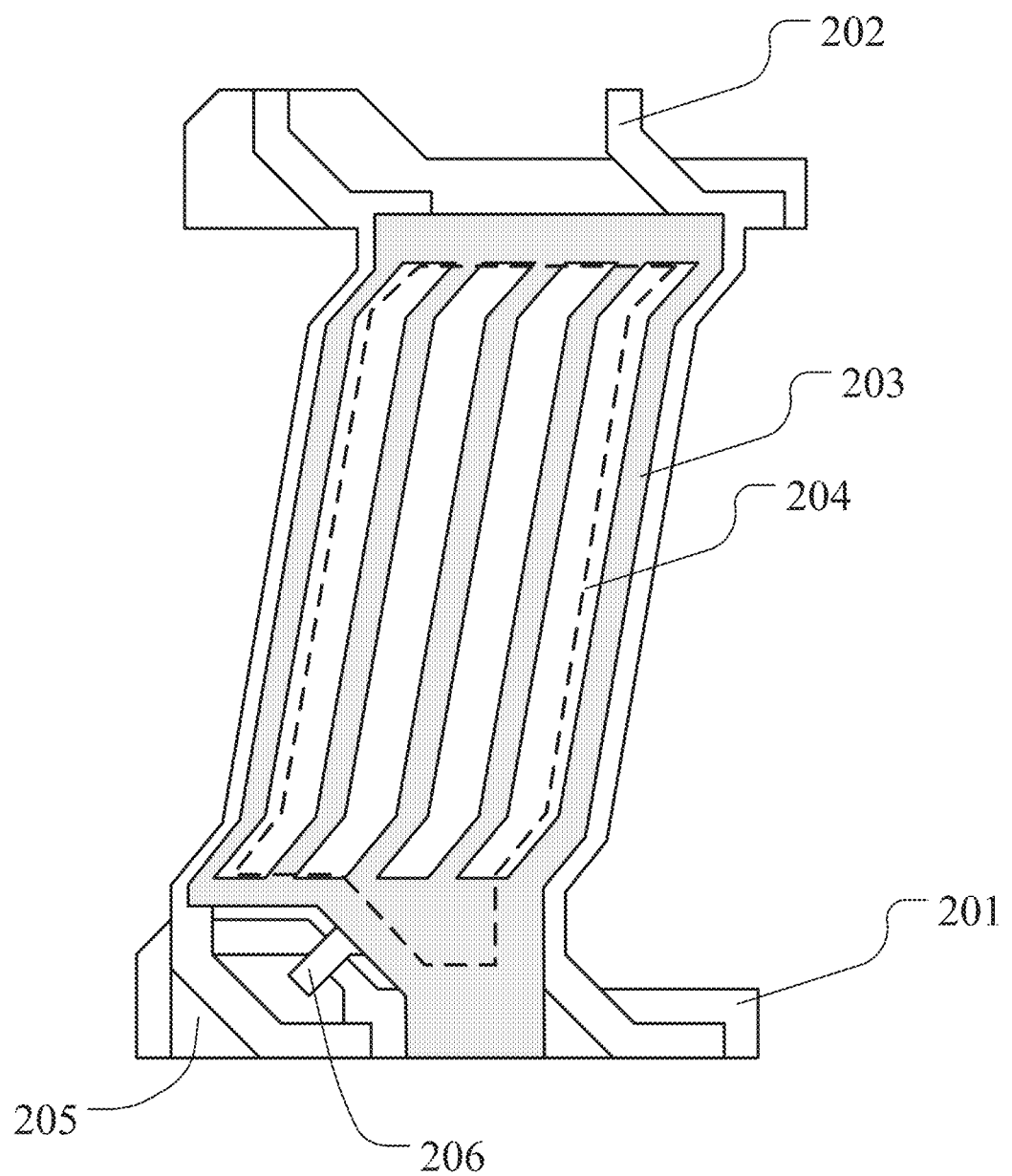
FIG. 2 illustrates a schematic structural diagram of an array substrate according to an embodiment of the present disclosure.

FIG. 2 illustrates a schematic structural diagram of an array substrate according to an embodiment of the present disclosure. As shown in FIG. 2, the array substrate according to the present embodiment includes: a substrate (not illustrated in the figure); a plurality of scan lines 201 and a plurality of data lines 202 disposed on the substrate intersecting each other and insulated from each other; a plurality of pixel elements defined by the intersection of the scan lines 201 and the data lines 202; a first transparent conductive layer 204 disposed on the substrate; and a second transparent conductive layer 203 disposed on the substrate and in parallel to and insulated from the first transparent conductive layer 204, wherein the data lines 202, the first transparent conductive layer 204 and the second transparent conductive layer 203 each include a plurality of bended portions, and the bended portions of the second transparent conductive layer 203 are parallel to those of the first transparent conductive layer 204; and the bended portions of the data lines 202 are parallel to those of the first transparent conductive layer 204 or those of the second transparent conductive layer 203.

The first transparent conductive layer 204 disposed on the substrate and the second transparent conductive layer 203 disposed on the substrate and in parallel to and insulated from the first transparent conductive layer 204 relate to a number of scenarios as particularly described below.

Figure 3:
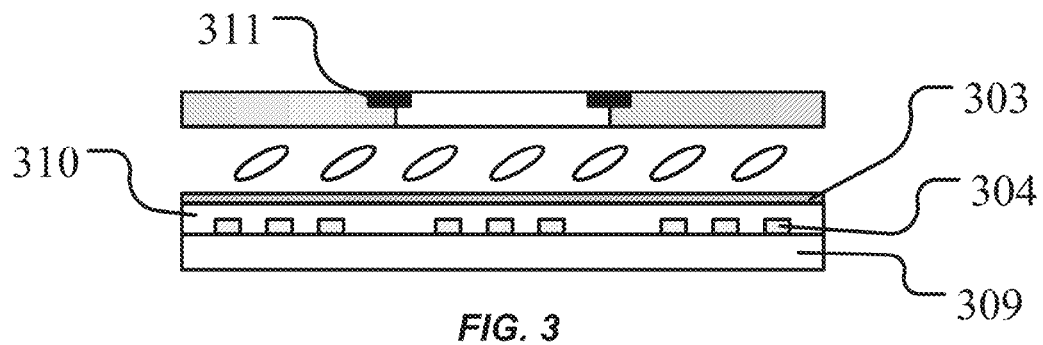
FIG. 3 illustrates a schematic structural diagram of a liquid crystal display device according to an embodiment of the present disclosure.

Referring to FIG. 2 and FIG. 3, FIG. 3 illustrates a schematic structural diagram of a liquid crystal display device according to the first embodiment of the present disclosure. An array substrate of a liquid crystal display device according to the present embodiment includes: a substrate 309; a first transparent conductive layer 304 disposed on the substrate 309, wherein the first transparent conductive layer 304 includes a plurality of first transparent electrodes parallel to each other, and there is a slit structure between adjacent ones of the first transparent electrodes and each of the first transparent electrodes includes a plurality of bended portions, and the edges of the first transparent conductive layer 304 include a plurality of bended portions parallel to the first transparent electrodes; a second transparent conductive layer 303 disposed on the substrate 309 and in parallel to and insulated from the first transparent conductive layer 304, wherein the first transparent conductive layer 304 being parallel to the second transparent conductive layer 303 refers to two planes being vertically parallel, i.e., they are arranged horizontally in the vertical direction; and a first insulation layer 310 disposed between the first transparent conductive layer 304 and the second transparent conductive layer 303.

If the first transparent conductive layer 304 disposed on the substrate is a pixel electrode layer, then the second transparent conductive layer 303 is a common electrode layer; or if the first transparent conductive layer 304 disposed on the substrate is a common electrode layer, then the second transparent conductive layer 303 is a pixel electrode layer. The locations of the first transparent conductive layer and the second transparent conductive layer can be interchanged, but the present embodiment is not limited in this respect, and the same will apply hereinafter.

Figure 4:
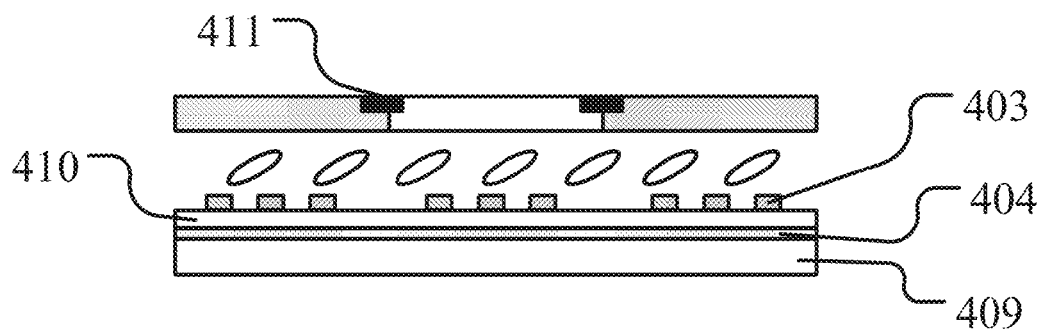
FIG. 4 illustrates a schematic structural diagram of a liquid crystal display device according to an embodiment of the present disclosure.

Referring to FIG. 2 and FIG. 4, FIG. 4 illustrates a schematic structural diagram of a liquid crystal display device according to the first embodiment of the present disclosure. An array substrate of a liquid crystal display device according to the present embodiment includes: a substrate 409; a first transparent conductive layer 404 disposed on the substrate 409; a second transparent conductive layer 403 disposed on the substrate 409 and in parallel to and insulated from the first transparent conductive layer 404, wherein the second transparent conductive layer 403 includes a plurality of second transparent electrodes parallel to each other, and there is a slit structure between adjacent ones of the second transparent electrodes, and each of the second transparent electrodes includes a plurality of bended portions, and the edges of the second transparent conductive layer 404 include a plurality of bended portions parallel to the second transparent electrodes, and here the first transparent conductive layer 404 being parallel to the second transparent conductive layer 403 refers to two planes being vertically parallel; and a first insulation layer 410 disposed between the first transparent conductive layer 404 and the second transparent conductive layer 403.

Figure 5:
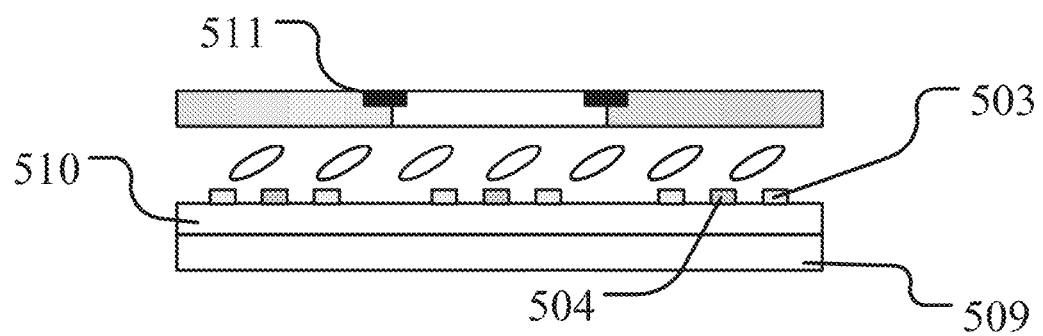
FIG. 5 illustrates a schematic structural diagram of a liquid crystal display device according to an embodiment of the present disclosure.

Referring to FIG. 2 and FIG. 5, FIG. 5 illustrates a schematic structural diagram of a liquid crystal display device according to the first embodiment of the present disclosure. An array substrate of a liquid crystal display device according to the present embodiment includes: a substrate 509; a first transparent conductive layer 504 disposed on the substrate 509; a second transparent conductive layer 503 disposed on the substrate 509 and in parallel to and insulated from the first transparent conductive layer 504. Both of the first transparent conductive layer 504 and the second transparent conductive layer 503 are transparent conductive layers in the same layer; and each of the first transparent conductive layer 504 and the second transparent conductive layer 503 includes a plurality of transparent electrodes parallel to each other, each of the plurality of parallel transparent electrodes includes a plurality of bended portions, and a plurality of bended portions are disposed at both edges of the first transparent conductive layer 504 and the edges of the second transparent conductive layer 503 to be parallel to the transparent electrodes. Herein the term "the first transparent conductive layer 504 being parallel to the second transparent conductive layer 503" refers to adjacent transparent electrodes being parallel to each other.

The liquid crystal display device according to the present embodiment can be embodied in any of the liquid crystal display structures above, but the present embodiment will not be limited in this respect. The data lines, the first transparent conductive layer and the second transparent conductive layer in the present embodiment each include a plurality of bended portions, and the plurality of bended portions can have a zigzag shape, indented shape, wave shape, three-segment bended shape, multi-segment bended shape, etc., and the present embodiment has been described taking the three-segment bended shape as an example without any limitation thereto.

Figure 6:
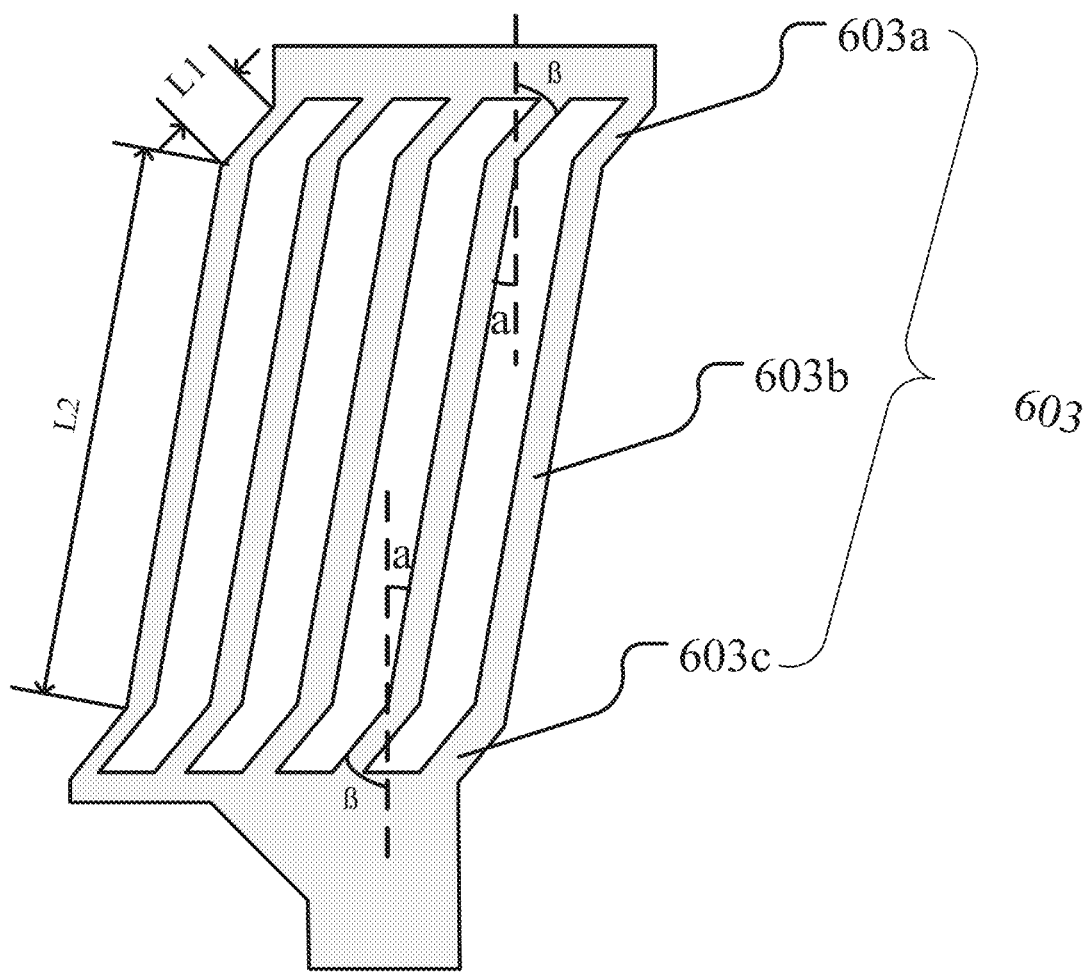
FIG. 6 illustrates a schematic structural diagram of a transparent electrode according to an embodiment of the present disclosure.

Referring to FIG. 6, FIG. 6 illustrates a schematic structural diagram of a transparent electrode according to the first embodiment of the present disclosure. The first transparent electrodes or the second transparent electrodes or the transparent electrodes each includes a first segment 603$a$, a second segment 603$b$ and a third segment 603$c$, wherein the first segment 603$a$ and the second segment 603$b$ are connected at a first bended portion, the second segment 603$b$ and the third segment 603$c$ are connected at a second bended portion, the sharp angle of the first segment 603$a$ relative to the vertical direction is $\beta$, the third segment 603$c$ is parallel to the first segment 603$a$, the sharp angle of the third segment 603$c$ relative to the vertical direction is $\beta$, and the sharp angle of the second segment 603$b$ to the vertical direction is $\alpha$, and then $\beta$ and $\alpha$ need to satisfy the relation: $\beta > \alpha$. The length of the first segment 603$a$ is L1, and the length of the third segment 603$c$ is equal to the length of the first segment 603$a$, that is, the length of the third segment 603$c$ is also L1, and the length of the second segment 603$b$ is L2, and then L1 and L2 need to satisfy the relation: $8L1 > L2 > 3L1$.

The data lines, the first transparent conductive layer and the second transparent conductive layer in the display device according to the present disclosure each include a plurality of bended portions parallel to each other, resulting in a three-segment bended pixel structure to thereby overcome the problem of Trace Mura and further make full use of a pixel space and improve the transmissivity of pixel elements so as to improve the transmissivity of an entire panel, and the bended portions of the data lines, the first transparent conductive layer and the second transparent conductive layer are parallel to each other to thereby avoid the problem of non-uniform display caused by inconsistent parasitic capacitances between the edges of the first transparent conductive layer or the second transparent conductive layer and the data lines due to inconsistent distances between the edges of the first transparent conductive layer or the second transparent conductive layer and the data lines.

Second Embodiment

Figure 7:
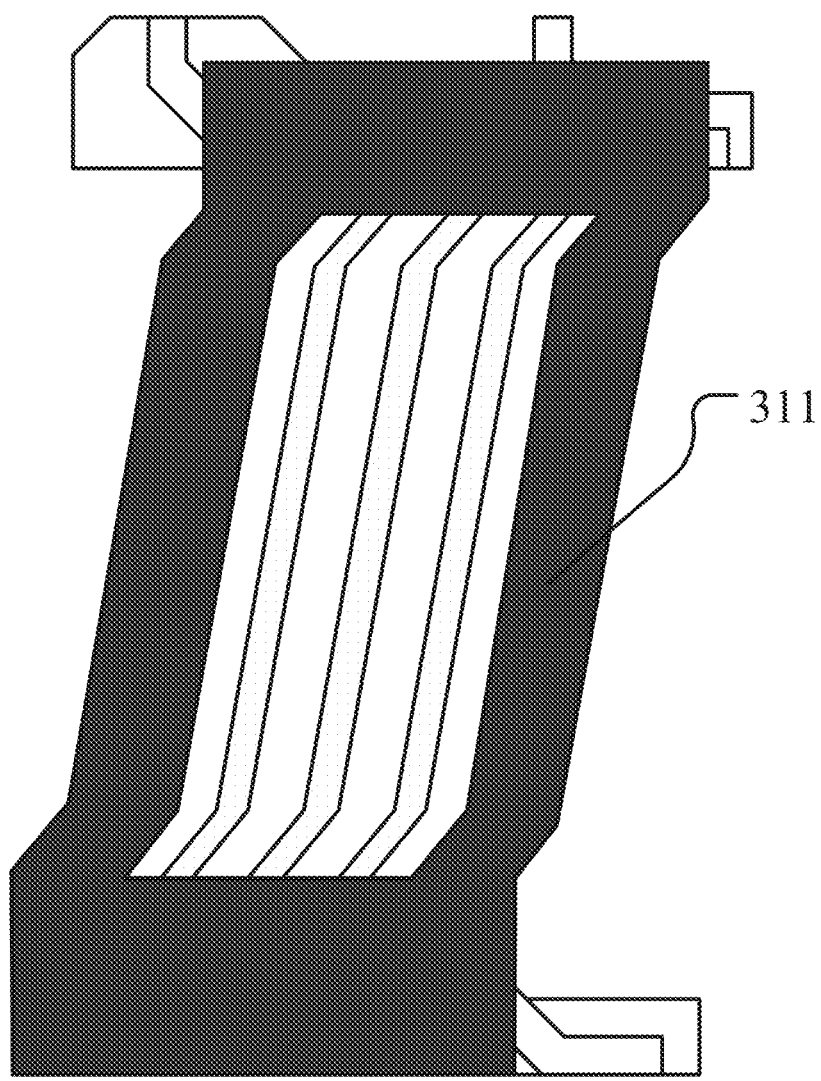
FIG. 7 illustrates a schematic structural diagram in a top view of a liquid crystal display device according to an embodiment of the present disclosure.

Referring to FIG. 2, FIG. 3 and FIG. 7, FIG. 7 illustrates a schematic structural diagram in a top view of a liquid crystal display device according to a second embodiment of the present disclosure. The liquid crystal display device according to the second embodiment includes: an array substrate as described above; a color filter substrate as described above; and a liquid crystal layer encapsulated between the array substrate and the color filter substrate.

As illustrated in FIG. 2, the array substrate includes: a substrate; a plurality of scan lines 201 and a plurality of data lines 202 disposed on the substrate intersecting each other and insulated from each other; a plurality of pixel elements defined by the intersection of the scan 201 lines and the data lines 202; a first transparent conductive layer 204 disposed on the substrate; and a second transparent conductive layer 203 disposed on the substrate and in parallel to and insulated from the first transparent conductive layer 204, wherein the data lines 202, the first transparent conductive layer 204 and the second transparent conductive layer 203 each include a plurality of bended portions, and the bended portions of the second transparent conductive layer 203 are parallel to those of the first transparent conductive layer 204; the bended portions of the data lines 202 are parallel to those of the first transparent conductive layer 204 or the second transparent conductive layer 203.

As illustrated in FIG. 3 and FIG. 7, the color filter substrate includes a black matrix layer 311 including a plurality of bended portions parallel to those of the data lines; or parallel to those of the first transparent conductive layer; or parallel to those of the second transparent conductive layer.

The present disclosure has been described above in details with reference to the preferred embodiments thereof, but particular implementations of the present disclosure shall not be taken to be limited only thereto. Those ordinarily skilled in the art can further make several apparent derivations or substitutions without departing from the spirit of the present disclosure, and all the derivations or substitutions shall be constructed as within the scope of the present disclosure.

What is claimed is:

1. An array substrate, comprising:
   a substrate;
   a plurality of scan lines and a plurality of data lines disposed on the substrate intersecting each other and insulated from each other;
   a plurality of pixel elements defined by the intersection of the data lines and the scan lines;
   a first transparent conductive layer disposed on the substrate; and
   a second transparent conductive layer disposed on the substrate in parallel to the first transparent conductive layer and insulated from the first transparent conductive layer,
   wherein the data lines, the first transparent conductive layer and the second transparent conductive layer each comprise a plurality of bent portions,
   wherein the bent portions of the second transparent conductive layer are parallel to the bended portions of the first transparent conductive layer; and/or
   the bent portions of the data lines are parallel to the bent portions of the first transparent conductive layer or the second transparent conductive layer;
   wherein the first transparent conductive layer comprises a plurality of first transparent electrodes parallel to each other, and a slit disposed between adjacent ones of the first transparent electrodes, and each of the first transparent electrodes comprising a plurality of bent portions;
   wherein the first transparent electrodes each comprises a first segment, a second segment, and a third segment, the first segment and the second segment being connected at a first bent portion, the second segment and the third segment being connected at a second bent portion, a sharp angle of the first segment relative to a vertical direction is defined as $\beta$, the third segment being parallel to the first segment, a sharp angle of the third segment relative to the vertical direction is defined as $\beta$, and a sharp angle of the second segment relative to the vertical direction is defined as $\alpha$, and $\beta$ and $\alpha$ satisfy the relation: $\beta > \alpha$.

2. The array substrate according to claim 1, wherein the bended portions comprise a zigzag shape, indented shape, wave shape, three-segment bended shape, or multi-segment bended shape.

3. The array substrate according to claim 1, further comprising a first insulation layer disposed between the first transparent conductive layer and the second transparent conductive layer.

4. The array substrate according to claim 1, wherein edges of the first transparent conductive layer comprise a plurality of bended portions parallel to the first transparent electrodes.

5. The array substrate according to claim 1, wherein a length of the first segment is defined as L1, and a length of the third segment is equal to the length L1 of the first segment, and a length of the second segment is defined as L2, and L1 and L2 satisfy the relation: $8L1 > L2 > 3L1$.

6. The array substrate according to claim 3, wherein the second transparent conductive layer comprises a plurality of second transparent electrodes parallel to each other, and a slit structure between adjacent ones of the second transparent electrodes, and each of the second transparent electrodes comprising a plurality of bended portions.

7. The array substrate according to claim 6, wherein edges of the second transparent conductive layer comprise a plurality of bended portions parallel to the second transparent electrodes.

8. The array substrate according to claim 6, wherein the second transparent electrodes each comprise a first segment, a second segment, and a third segment, the first segment and the second segment being connected at a first bended portion, the second segment and the third segment being connected at a second bended portion, a sharp angle of the first segment relative to a vertical direction is defined as $\beta$, the third segment being parallel to the first segment, a sharp angle of the third segment relative to the vertical direction is defined as $\beta$, and a sharp angle of the second segment relative to the vertical direction is defined as $\alpha$, and $\beta$ and $\alpha$ satisfy the relation: $\beta > \alpha$.

9. The array substrate according to claim 8, wherein a length of the first segment is defined as L1, and a length of the third segment is equal to the length L1 of the first segment, and a length of the second segment is defined as L2, and L1 and L2 satisfy the relation: $8L1 > L2 > 3L1$.

10. The array substrate according to claim 2, wherein the first transparent conductive layer and the second transparent conductive layer each are transparent conductive layers in a same layer.

11. The array substrate according to claim 10, wherein the first transparent conductive layer and the second transparent conductive layer each comprise a plurality of transparent electrodes parallel to each other, and each of the plurality of transparent electrodes comprising a plurality of bended portions.

12. The array substrate according to claim 11, wherein edges of the first transparent conductive layer comprise a plurality of bended portions parallel to the transparent electrodes and edges of the second transparent conductive layer comprise a plurality of bended portions parallel to the transparent electrodes.

13. The array substrate according to claim 11, wherein the transparent electrodes each comprise a first segment, a second segment, and a third segment, the first segment and the second segment being connected at a first bended portion, the second segment and the third segment being connected at a second bended portion, a sharp angle of the first segment relative to a vertical direction is $\beta$, the third segment being parallel to the first segment, a sharp angle of the third segment relative to the vertical direction is defined as $\beta$, and a sharp angle of the second segment relative to the vertical direction is defined as $\alpha$, and $\beta$ and $\alpha$ satisfy the relation: $\beta > \alpha$.

14. The array substrate according to claim 13, wherein a length of the first segment is defined as L1, and a length of the third segment is equal to the length L1 of the first segment, and a length of the second segment is defined as L2, and L1 and L2 satisfy the relation: $8L1 > L2 > 3L1$.

15. A liquid crystal display device comprising an array substrate, the array substrate comprising:
   a substrate;
   a plurality of scan lines and a plurality of data lines disposed on the substrate intersecting each other and insulated from each other, and a plurality of pixel elements defined by the scan lines and the data lines;

a plurality of pixel elements defined by the intersection of the scan lines and the data lines;

a first transparent conductive layer disposed on the substrate; and a second transparent conductive layer disposed on the substrate in parallel to the first transparent conductive layer and insulated from the first transparent conductive layer, wherein the data lines, the first transparent conductive layer and the second transparent conductive layer each comprise a plurality of bended portions, wherein the bended portions of the second transparent conductive layer are parallel to the bended portion of the first transparent conductive layer; and/or the bended portions of the data lines are parallel to the bended portion of the first transparent conductive layer or the second transparent conductive layer;

a color filter substrate; and a liquid crystal layer encapsulated between the array substrate and the color filter substrate;

wherein the first transparent conductive layer comprises a plurality of first transparent electrodes parallel to each other, and a slit disposed between adjacent ones of the first transparent electrodes, and each of the first transparent electrodes comprising a plurality of bended portions;

wherein the first transparent electrodes each comprise a first segment, a second segment, and a third segment, the first segment and the second segment being connected at a first bended portion, the second segment and the third segment being connected at a second bended portion, a sharp angle of the first segment relative to a vertical direction is defined as $\beta$, the third segment being parallel to the first segment, a sharp angle of the third segment relative to the vertical direction is defined as $\beta$, and a sharp angle of the second segment relative to the vertical direction is defined as $\alpha$, and $\beta$ and $\alpha$ satisfy the relation: $\beta > \alpha$.

16. The liquid crystal display device according to claim 15, wherein the color filter substrate comprises a black matrix layer comprising a plurality of bended portions parallel to the bended portions of the data lines; or parallel to the bended portions of the first transparent conductive layer; or parallel to the bended portions of the second transparent conductive layer.

* * * * *